United States Patent
Roesner et al.

(10) Patent No.: US 6,420,228 B1
(45) Date of Patent: Jul. 16, 2002

(54) METHOD FOR THE PRODUCTION OF A DRAM CELL CONFIGURATION

(75) Inventors: Wolfgang Roesner, München; Lothar Risch, Neubiberg; Franz Hofmann, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/851,051

(22) Filed: May 8, 2001

Related U.S. Application Data (62) Division of application No. 09/071,798, filed on May 4, 1998, now Pat. No. 6,255,684.

(30) Foreign Application Priority Data

May 2, 1997 (DE) .......................................... 197 18 721

(51) Int. Cl.$^7$ .......................................... H01L 21/8242
(52) U.S. Cl. ..................................... 438/244; 438/242
(58) Field of Search ................................ 438/243–249, 438/386–392, 242

(56) References Cited

U.S. PATENT DOCUMENTS

| | | | | |
|---|---|---|---|---|
| 4,797,373 A | * | 1/1989 | Malhi et al. | |
| 4,824,793 A | * | 4/1989 | Richardson et al. | |
| 5,034,341 A | * | 7/1991 | Itoh | |
| 5,302,541 A | * | 4/1994 | Akazawa | |
| 5,376,575 A | | 12/1994 | Kim et al. | |
| 5,477,071 A | | 12/1995 | Rösner et al. | |
| 5,519,236 A | | 5/1996 | Ozaki | |
| 5,753,526 A | * | 5/1998 | Ozaki | |
| 5,909,618 A | | 6/1999 | Forbes et al. | |
| 5,994,735 A | | 11/1999 | Maeda et al. | |
| 6,034,389 A | | 3/2000 | Burns et al. | |

FOREIGN PATENT DOCUMENTS

| | | |
|---|---|---|
| DE | 38 01 525 A1 | 9/1988 |
| DE | 38 14 120 A1 | 7/1989 |
| DE | 44 08 764 A1 | 9/1994 |
| DE | 195 19 160 C1 | 9/1996 |

\* cited by examiner

*Primary Examiner*—Jey Tsai
(74) *Attorney, Agent, or Firm*—Laurence A. Greenberg; Werner H. Stemer; Gregory L. Mayback

(57) ABSTRACT

A DRAM cell configuration includes a vertical MOS transistor per memory cell. First source/drain regions of the transistor each belong to two adjacent transistors and adjoin a bit line. Second source/drain regions of the transistor are connected to a storage node. A gate electrode of the transistor has exactly two sides adjoined by a gate oxide. The DRAM cell configuration can be produced by using three masks with a memory cell area of 4 $F^2$. F is a minimum structure size which can be produced by using the respective technology.

5 Claims, 5 Drawing Sheets

METHOD FOR THE PRODUCTION OF A DRAM CELL CONFIGURATION

CROSS-REFERENCE TO RELATED APPLICATION

This is a division of U.S. application Ser. No. 09/071,798, filed May 4, 1998, now U.S. Pat. No. 6,255,684.

BACKGROUND OF THE INVENTION

1. Field of the Invention

The invention relates to a method for the production of a DRAM cell configuration.

In DRAM cell configurations, that is to say memory cell configurations with dynamic random access, use is made almost exclusively of so-called single-transistor memory cells. A single-transistor memory cell includes a read-out transistor and a storage capacitor. The information is stored in the storage capacitor in the form of an electric charge, which represents a logic value, 0 or 1. That information can be read out through a bit line by driving a readout transistor over a word line.

Since storage density increases from memory generation to memory generation, the required area of the single-transistor memory cell must be reduced from generation to generation. Since limits are imposed on the reduction of the structure sizes by a minimum structure size F which can be produced by using the respective technology, that is also associated with an alteration of the single-transistor memory cell. Thus, up until the 1 Mbit generation, both the read-out transistor and the storage capacitor were realized as planar components. Starting with the 4 Mbit memory generation, a further reduction in area had to be effected through the use of a three-dimensional configuration of the read-out transistor and the storage capacitor.

One possibility is to realize the storage capacitor in a trench rather than in a planar manner (see, for example, a paper by K. Yamada et al. entitled "A Deep Trenched Capacitor Technology for 4 Mbit DRAMs", in Proc. Intern. Electronic Devices and Materials IEDM 85, page 702).

Another possibility is to use vertical MOS transistors as described in U.S. Pat. No. 5,376,575, for example. In the production method described therein, each vertical MOS transistor encompasses two opposite sides of a trench along which a bit line runs. Doped regions which act as a drain region of the MOS transistors are provided in the upper area of the sides. The surface of the sides is provided with gate oxide. A gate electrode is provided which covers the opposite surface of the gate oxide. The gate electrode is insulated from an inferior, buried bit line and from a superior storage node, in each case by an insulating layer. Shallow trenches which run transversely to the bit lines and in which word lines running transversely to the bit lines are disposed are provided in the surface of the substrate. The word lines laterally adjoin the gate electrode and are thus connected thereto. The smallest memory cell area that can be achieved using that method is 6 $F^2$.

German Published, Non-Prosecuted Patent Application DE 38 44 120 A1 discloses a DRAM configuration in which trenches are provided in a semiconductor substrate. A drain region is provided at the bottom of the trench. A source region is provided at the surface of the substrate. The side walls of the trench are provided with gate oxide and a gate electrode and act as a channel region. The gate electrodes are embedded in an insulation layer in which a contact hole reaches down to the surface of the drain region located at the bottom of the trench and is provided with an electrode. A capacitor is provided laterally with respect to the trench on the surface of the semiconductor substrate. The lateral configuration of the capacitor and the transistor results in an increased area requirement of the memory cell.

A DRAM cell configuration in which read-out transistors are constructed as vertical transistors is mentioned in a paper by P. Chatterjee et al. in IEDM 86 pages 128–131. A read-out transistor has a first source/drain region which annularly surrounds a gate electrode and is part of a bit line. A second source/drain region of the read-out transistor is produced by outdiffusion of dopant of a storage node which is realized in a depression and is disposed underneath the gate electrode. Word lines, which are in part composed of gate electrodes, run above the bit lines. The read-out transistor encompasses at least sides of the gate electrode which are parallel to the bit lines. The area of a memory cell is 9 $F^2$.

German Patent DE 195 19 160 C1 proposes a DRAM cell configuration which includes one vertical MOS transistor per memory cell. A first source/drain region of the transistor is connected to a storage node of a storage capacitor, a channel region of the transistor is annularly enclosed by a gate electrode, and a second source-drain region of the transistor is connected to a buried bit line. The storage capacitor is either a planar capacitor or a stacked capacitor. The DRAM cell configuration can be produced with a memory cell area of 4 $F^2$.

The area of a memory cell of a DRAM in the 1 Gbit generation is intended to be only about 0.2 $\mu m^2$. In that case, the storage capacitor must have a capacitance of 20 to 30 fF. Such a capacitance can only be achieved at great expense given a cell area of the kind that is available in the 1 Gbit generation, both in the case of planar capacitors and in the case of stacked capacitors: in the case of planar capacitors, it is necessary to apply a capacitor dielectric made of a material having a particularly high dielectric constant. Since the known ferroelectric and paraelectric materials which are suitable therefor contaminate the apparatuses which are usually used to produce DRAMs, the DRAM to be produced must be placed into an additional second apparatus for the application of the dielectric. In the case of the stacked capacitor, a relatively complicated polysilicon structure is required in order to enlarge the area and thus the capacitance of the storage capacitor, which structure is all the more difficult to produce as the cell area becomes smaller.

SUMMARY OF THE INVENTION

It is accordingly an object of the invention to provide a method for the production of a DRAM cell configuration, which overcome the hereinafore-mentioned disadvantages of the heretofore-known devices and methods of this general type, and in which the DRAM cell configuration has single-transistor memory cells as its memory cells and can be produced with the requisite component density for the 1 Gbit generation.

With the foregoing and other objects in view there is provided, in accordance with the invention, a DRAM cell configuration, comprising a substrate of semiconductor material; memory cells each including a read-out transistor integrated in the substrate as a vertical MOS transistor, and a storage capacitor having a storage node; a bit line and a word line; the vertical MOS transistor having a gate electrode and two first source/drain regions and second source/drain regions, the first source/drain regions disposed separately or isolated one after the other along the bit line, adjoining the bit line and each belonging to a further, adjacent vertical MOS transistor, and the second source/ drain regions connected to the storage node; a gate oxide adjoining exactly two opposite sides, surfaces or flanks of the gate electrode; two channel regions each adjoining the gate oxide; the gate electrode disposed between the two channel regions; the gate electrodes of adjacent vertical MOS transistors along the word line connected to one another; and the gate electrode and the storage node disposed one under the other.

With the objects of the invention in view, there is also provided a method for the production of a DRAM cell configuration, which comprises producing memory cells each having a read-out transistor and a storage capacitor with a storage node; producing bit and word lines; forming the read-out transistor as a vertical MOS transistor integrated in a substrate of semiconductor material; providing the MOS transistor with two first source/drain regions each belonging to a further, adjacent vertical MOS transistor, disposed separately or isolated one after the other along the bit line and adjoining the bit line, two second source/drain regions each connected to the storage node, and a gate electrode; producing a gate oxide adjoining exactly two opposite sides, surfaces or flanks of the gate electrode; producing two channel regions each adjoining the gate oxide; producing the gate electrode between the two channel regions; electrically connecting the gate electrodes of adjacent MOS transistors along the word line; and placing the gate electrode and the storage node one under the other.

In the DRAM cell configuration according to the invention, single-transistor memory cells are provided in which the read-out transistor is constructed as a vertical MOS transistor. Each MOS transistor encompasses two opposite sides of a gate electrode which run parallel to the word line and adjoin a gate oxide. The MOS transistor has exactly two first source/drain regions, which are disposed spatially separated along a bit line through which they are connected. Each first source/drain region belongs to two neighboring or adjacent transistors along the bit line, which leads to a small cell area.

It is advantageous to realize the storage capacitor in a trench. The outlay for producing such capacitors for the 1 Gbit generation is distinctly less than that for producing planar capacitors or stacked capacitors.

If elements are provided in a self-aligned manner, that is to say without using masks to be aligned, it is possible to achieve a reduction in the cell area since it is not necessary to take alignment tolerances into account. According to one embodiment, the storage nodes are provided in a self-aligned manner under the word lines and are insulated from neighboring storage nodes. In addition, the contacts of the first source/drain regions to the bit lines are opened in a self-aligned manner. This permits the production of cell areas of 4 $F^2$ with just 3 masks.

Second source/drain regions of the MOS transistor are connected to a storage node. They are preferably produced by outdiffusion of dopant from the storage node into a suitable structured layer. As a result, the storage nodes are connected in a self-aligned manner to the second source/ drain regions and the cell area is kept small. A junction depth, that is to say the path of minimal separation between source and drain perpendicular to the current flow and perpendicular to the gate electrode, is also kept small, which has a positive influence on short-channel effects, such as punch-through.

It lies within the scope of the invention to construct the gate electrode as part of the word line, which reduces the number of necessary process steps and effects a self-aligned connection between the gate electrode and the word line.

When capacitors realized in trenches are used, it is advantageous to provide a further layer doped by a conductivity type opposite to the conductivity type of the capacitor plate, underneath the layer which serves as a capacitor plate. The substrate is thereby electrically insulated from the capacitor plate, which can be connected separately to a potential.

According to one embodiment, in order not to etch $SiO_2$ too deeply when opening the contacts of the first source/ drain regions to the bit lines, which can lead to a short circuit between the word lines and the bit lines, it is advantageous to apply a layer of silicon nitride to the substrate at the beginning of the DRAM production. During the etching of $SiO_2$, the uncovering of the layer of silicon nitride supplies an end-point signal for the etching as a result of a change of physical conditions, such as the gas composition, for instance. In order to avoid superficial damage to the substrate by silicon nitride, it is advantageous to apply a thin $SiO_2$ layer before the silicon nitride layer is produced. Other features which are considered as characteristic for the invention are set forth in the appended claims.

Although the invention is illustrated and described herein as embodied in a method for the production of a DRAM cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
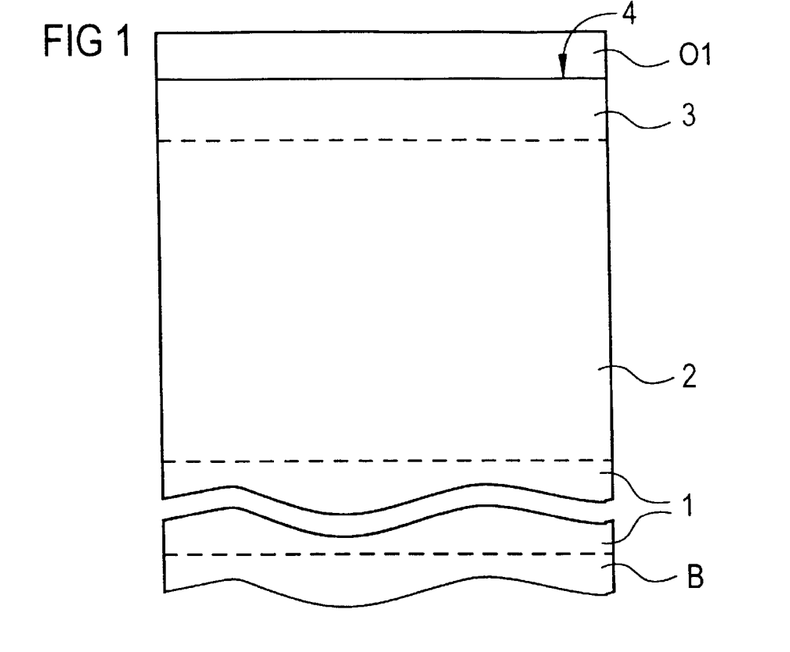
FIG. 1 is a fragmentary, diagrammatic, sectional view perpendicular to a surface of a first substrate with a doped region above which three layers of semiconductor material are disposed, with a first $SiO_2$ layer applied above them.

Referring now to the figures of the drawings in detail and first, particularly, to FIG. 1 thereof, there is seen a starting material which is a substrate that is made, for example, of monocrystalline silicon which is doped in a region B of a first conductivity type. The region B has, for example, a p-type doping with a dopant concentration of approximately $3*10^{16}$ cm$^{-3}$. The region B is provided with a first layer 1 which is doped by a second conductivity type, opposite to the first conductivity type having a dopant concentration of approximately $10^{20}$ cm$^{-3}$, with a second layer 2, which is doped by the first conductivity type having a dopant concentration of approximately $3*10^{17}$ cm$^{-3}$, and with a third layer 3, which is doped by the second conductivity type having a dopant concentration of approximately $10^{21}$ cm$^{-3}$. The first layer 1, the second layer 2 and the third layer 3 are produced by epitaxial growth, for example. The third layer 3 forms a surface 4 of the substrate. The first layer 1 has a thickness of approximately 9 μm, the second layer 2 has a thickness of approximately 1 μm and the third layer 3 has a thickness of approximately 200 nm.

A first SiO$_2$ layer O1 having a thickness of approximately 150 nm is deposited on the surface 4, as is seen in FIG. 1, in a TEOS process. The first SiO$_2$ layer O1 is structured with the aid of a first non-illustrated photoresist mask, and parts of the surface 4 are uncovered in order to be able to produce first trenches G1.

Figure 2:
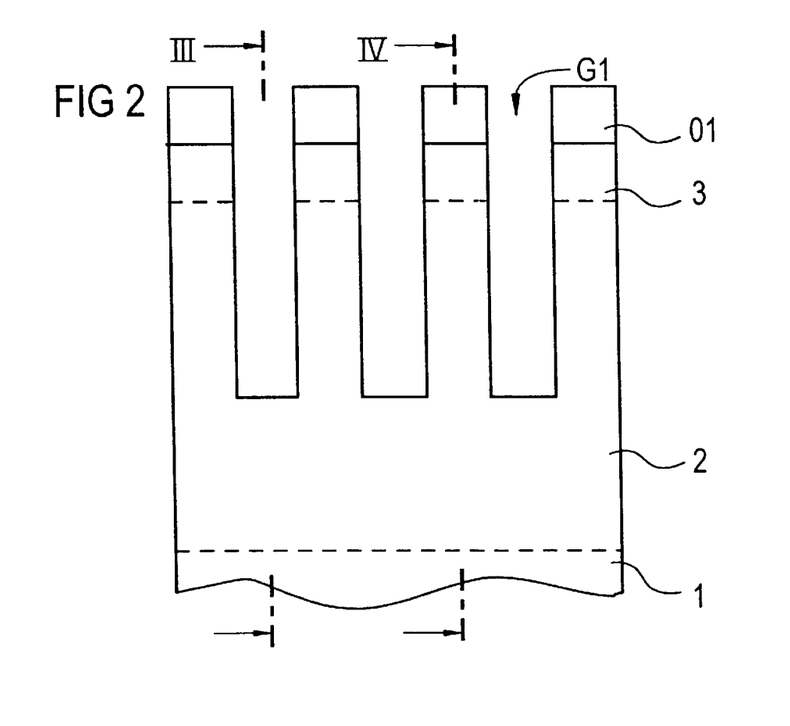
FIG. 2 is a fragmentary, sectional view according to FIG. 1 after the production of first trenches.

After the first photoresist mask has been removed, the first trenches G1 are etched selectively with respect to SiO$_2$, as is seen in FIG. 2, in an anisotropic dry etching process. HBr, NF$_3$, He and O$_2$ are suitable, for example, for an etching process in which silicon is attacked selectively with respect to SiO$_2$. The first trenches G1 are produced with a depth of approximately 800 nm and reach down into the second layer 2. The first trenches G1 have a strip-shaped cross-section parallel to the surface 4 and run substantially parallel over the entire cell array. The first trenches G1 have a width of approximately 200 nm and a length of approximately 50 μm. A distance between the centers of neighboring first trenches G1 is approximately 400 nm, which corresponds to twice a minimum structure size F=200 nm in the technology used.

Figure 4:
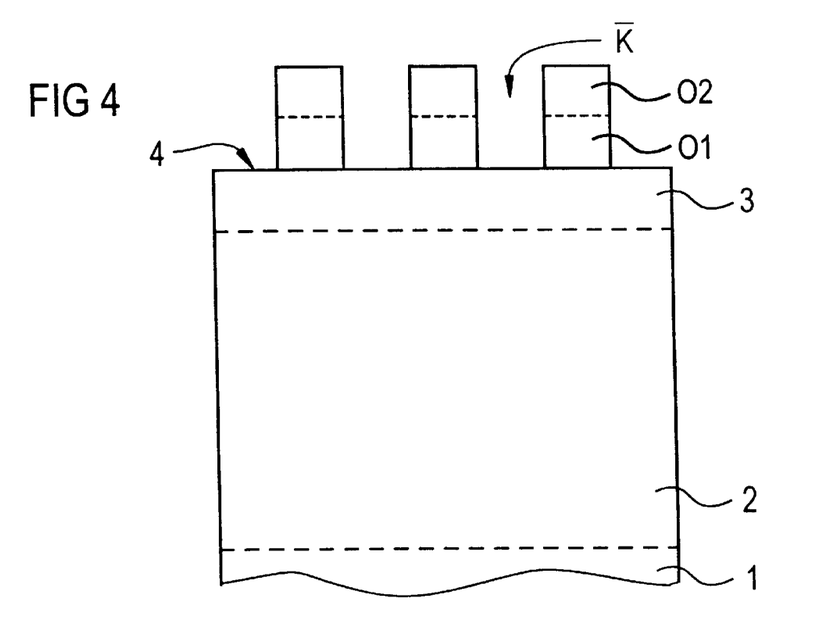
FIG. 4 is a fragmentary, sectional view taken along the line IV–IV of FIG. 3, in the direction of the arrows.

As is seen in FIG. 4, the first trenches G1 are filled by depositing a second SiO$_2$ layer O2 having a thickness of 150 nm, for example, in a TEOS process. The surface 4 is covered by parts of the first SiO$_2$ layer O1 and by parts of the second SiO$_2$ layer O2, that is to say by a total of 300 nm of SiO$_2$.

Figure 3:
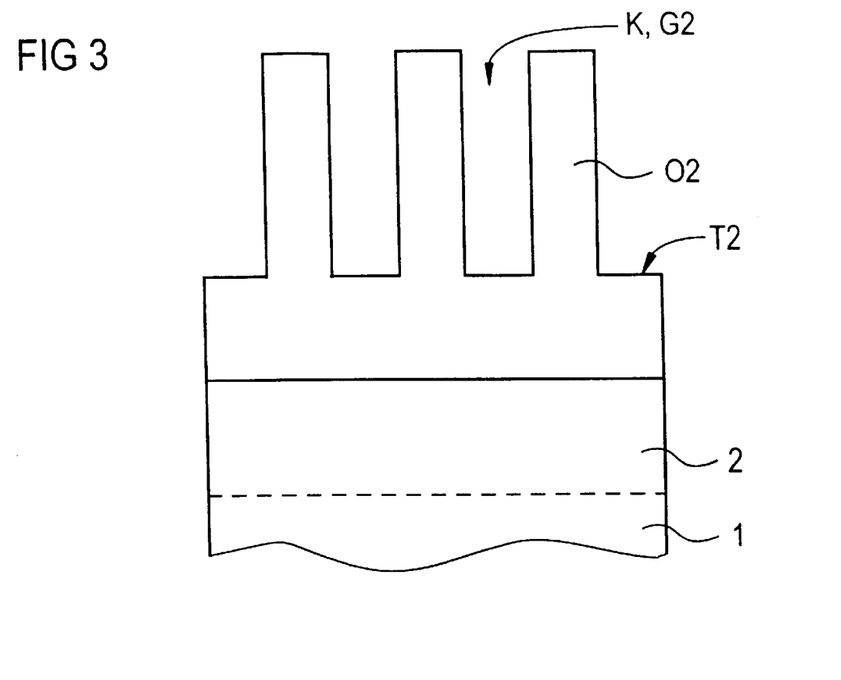
FIG. 3 is a fragmentary, sectional view taken along the line III—III of FIG. 2, in the direction of the arrows, along a first trench after the formation of a second $SiO_2$ layer which fills the first trenches, and after the etching of $SiO_2$ for the purpose of producing second trenches, wherein this section retains its appearance even after process steps relating to FIGS. 5 and 6.

As is seen in FIG. 3, in order to form second trenches G2, SiO$_2$ is etched selectively with respect to silicon through the use of an isotropic dry etching, with the aid of a second photoresist mask down to a second depth T2, which lies above an interface between the first layer 1 and the second layer 2 and below an interface between the second layer 2 and the third layer 3 and is approximately 400 nm from the surface 4. In this case, parts of the surface 4, which is not attacked due to the selectivity of the etching, are uncovered, as is seen in FIG. 4. CHF$_3$, CF$_4$ and/or Ar, for example, are suitable for an etching process in which SiO$_2$ is attacked selectively with respect to silicon.

Figure 5:
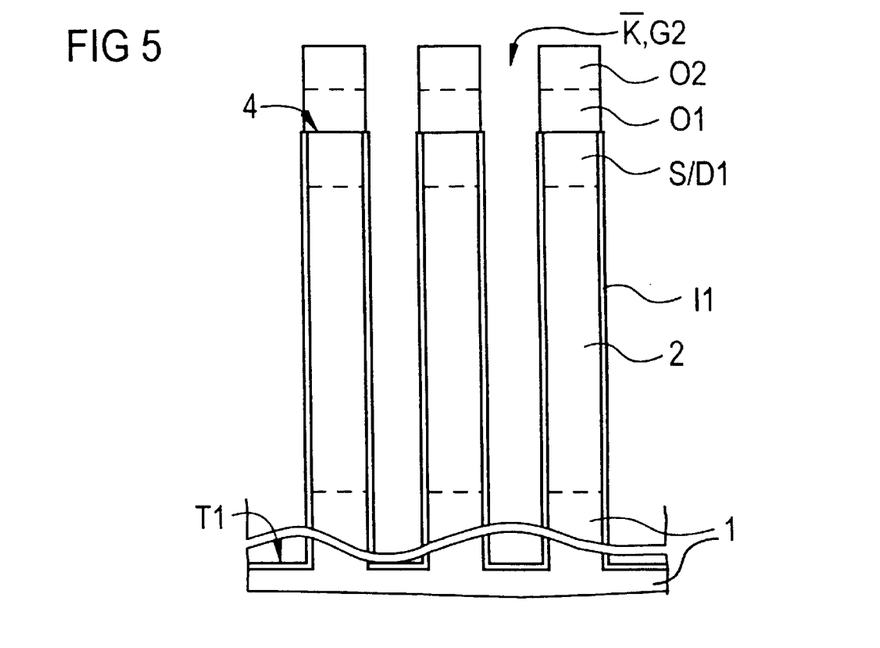
FIG. 5 is a fragmentary, sectional view showing the section of FIG. 4 after the etching of semiconductor material which concludes the formation of the second trenches, and after the production of a first insulation structure.
Figure 6:
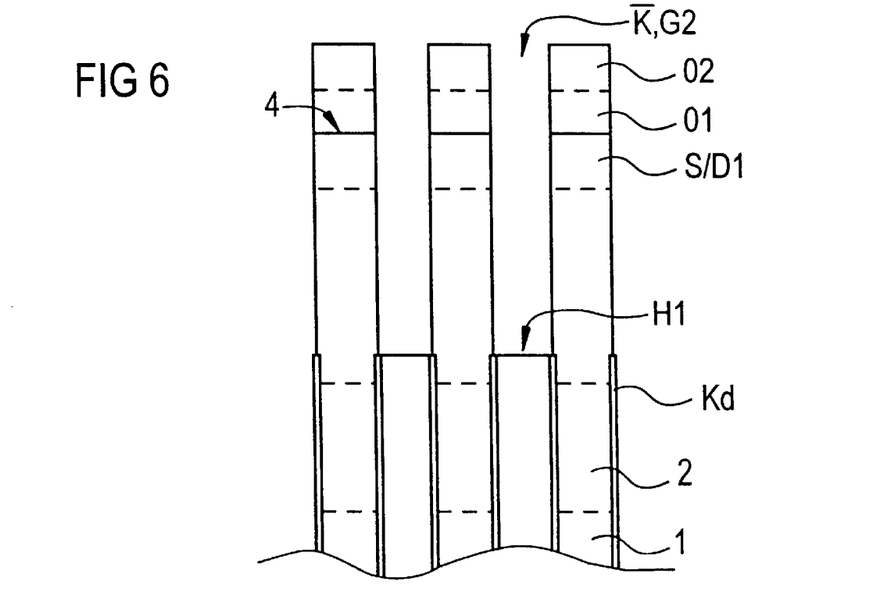
FIG. 6 is a fragmentary, sectional view showing the section of FIG. 5 after the second trenches have been filled with semiconductor material up to a first level and after the removal of parts of the first insulation structure, thereby producing capacitor dielectrics.

As is seen in FIG. 5, silicon is subsequently etched selectively with respect to SiO$_2$ down to a first depth T1 within the first layer 1. The first depth T1 lies 10 μm, for example, below the surface 4. The second trenches G2 that have been produced run e.g. perpendicularly to the first trenches G1. The second trenches G2 have a width of approximately 200 nm and a length of approximately 50 μm. A distance between the centers of neighboring second trenches G2 is approximately 400 nm. The first trenches G1, which are partially filled with SiO$_2$, and the second trenches G2 cross at crossover regions K. The second trenches G2 have the second depth T2 at the crossover regions K seen in FIG. 3. The second trenches G2 have the first depth T1 in regions $\overline{K}$ located between the crossover regions K, as is seen in FIG. 5. The second trenches G2 thus cut through the third layer 3 and the second layer 2 in the regions $\overline{K}$ located between the crossover regions K. The second trenches G2 have a strip-shaped cross-section parallel to the surface 4 and run substantially parallel. Remaining parts of the third layer 3 which are bounded by the first trenches G1 and the second trenches G2 are suitable as first source/drain regions S/D1. A first insulation structure I1 is produced by thermal oxidation of those areas of semiconductor material which adjoin the second trenches G2, as is seen in see FIG. 5. The second trenches G2 are subsequently filled by depositing semiconductor material which is doped by the second conductivity type with a dopant concentration of approximately $10^{21}$ cm$^{-3}$. The thickness of the applied semiconductor material is approximately 200 nm. Silicon is subsequently etched selectively with respect to SiO$_2$, in such a way that the second trenches G2 are filled with semiconductor material up to a first level H1 in the regions $\overline{K}$ located between the crossover regions K. The first level H1 is situated above an interface between the first layer 1 and second layer 2 and below a second depth T2. The first level H1 lies approximately 600 nm below the surface 4. Parts of the first insulation structure I1 which are uncovered as a result are removed by a wet etching process with HF. Remaining parts of the first insulation structure I1 are suitable as capacitor dielectrics Kd, as is seen in FIG. 6.

The second trenches G2 are subsequently filled by depositing semiconductor material which is doped by the second conductivity type with a dopant concentration of approximately $10^{21}$ cm$^{-3}$. The thickness of the deposited semiconductor material is approximately 200 nm. Silicon is subsequently etched selectively with respect to SiO$_2$, in such a way that the second trenches G2 are filled with semiconductor material up to a second level H2, which lies above the first level H1 and below the second depth T2, in the regions $\overline{K}$ located between the crossover regions K. The second level H2 lies approximately 100 nm above the first level H1. The semiconductor material up to the second level H2 in the regions $\overline{K}$ of the second trenches G2 which are located between the crossover regions K is suitable as storage nodes Sp. Accordingly, the storage nodes Sp reach from the second layer 2 as far as into the first layer 1.

Figure 7:
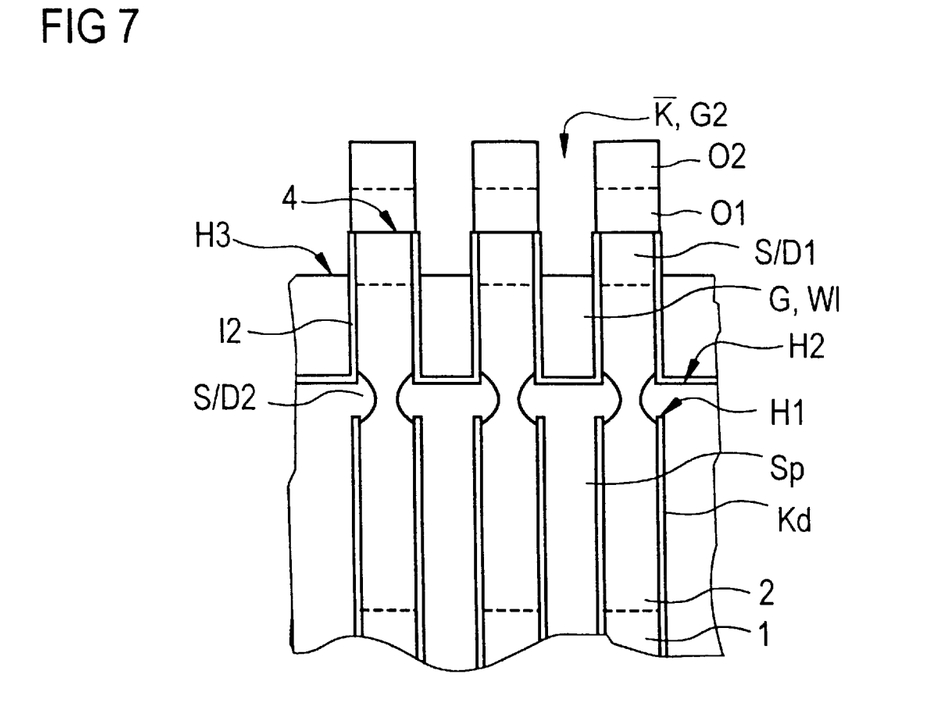
FIG. 7 is a fragmentary, sectional view showing the section of FIG. 6 after the production of second source/drain regions, gate oxides, word lines and gate electrodes.

Dopant diffuses out of the storage nodes into the second it layer 2 by using an RTP process. Resultant regions doped by the second conductivity type are suitable as second source/drain regions S/D2, which are seen in FIG. 7.

A gate oxide I2 is produced within the second trenches G2 through the use of thermal oxidation, for example. Conductive material, which contains e.g. polysilicon and/or metal silicide, is subsequently deposited in order to fill the second trenches G2. The thickness of the deposited conductive material is approximately 200 nm. The conductive material is etched selectively with respect to SiO$_2$, in such a way that the second trenches G2 are filled with conductive material up to a third level H3, which lies above the interface between the second layer 2 and the third layer 3 and below the surface 4, in the regions K̄ located between the crossover regions K, as is seen in FIG. 7. The third level H3 lies approximately 150 nm below the surface 4. The deposited conductive material forms word lines W1 which are suitable as gate electrodes G in the regions K̄ located between the crossover regions K. The gate electrodes G are thus produced in a self-aligned manner above the storage nodes Sp.

The second trenches G2 are filled by depositing SiO$_2$, in a TEOS process. The thickness of the deposited SiO$_2$ is approximately 200 nm. SiO$_2$ is subsequently etched selectively with respect to silicon until the surface 4 is uncovered. The first SiO$_2$ layer O1 and the second SiO$_2$ layer O2 are completely removed by this step. Since only the first source/drain regions S/D1 and insulating materials adjoin a section along the surface 4, contacts to the first source/drain regions S/D1 are thereby opened in a self-aligned manner.

Figure 8:
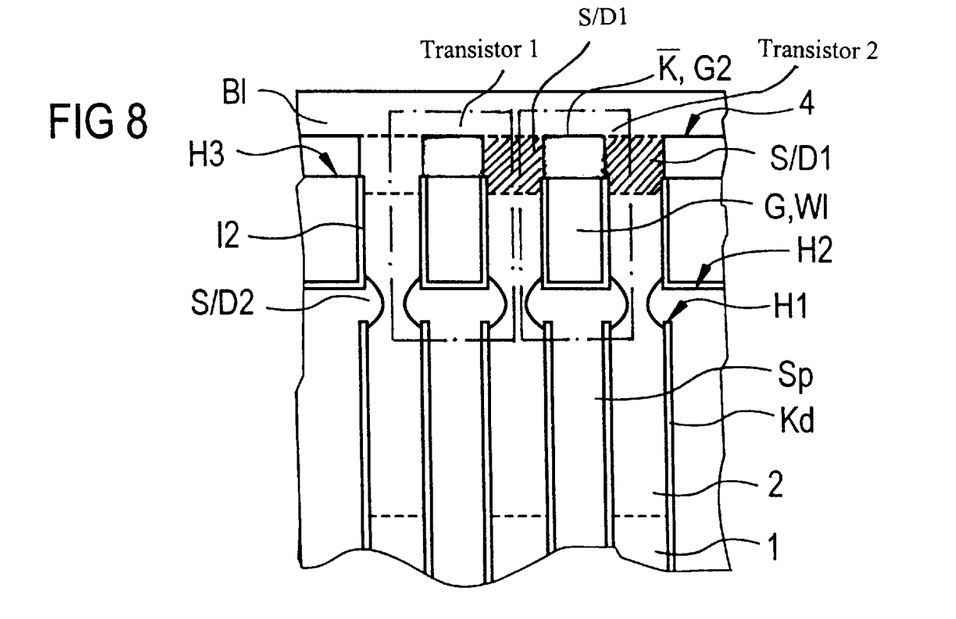
FIG. 8 is a fragmentary, sectional view showing the section of FIG. 7 after the production of bit lines.
Figure 9:
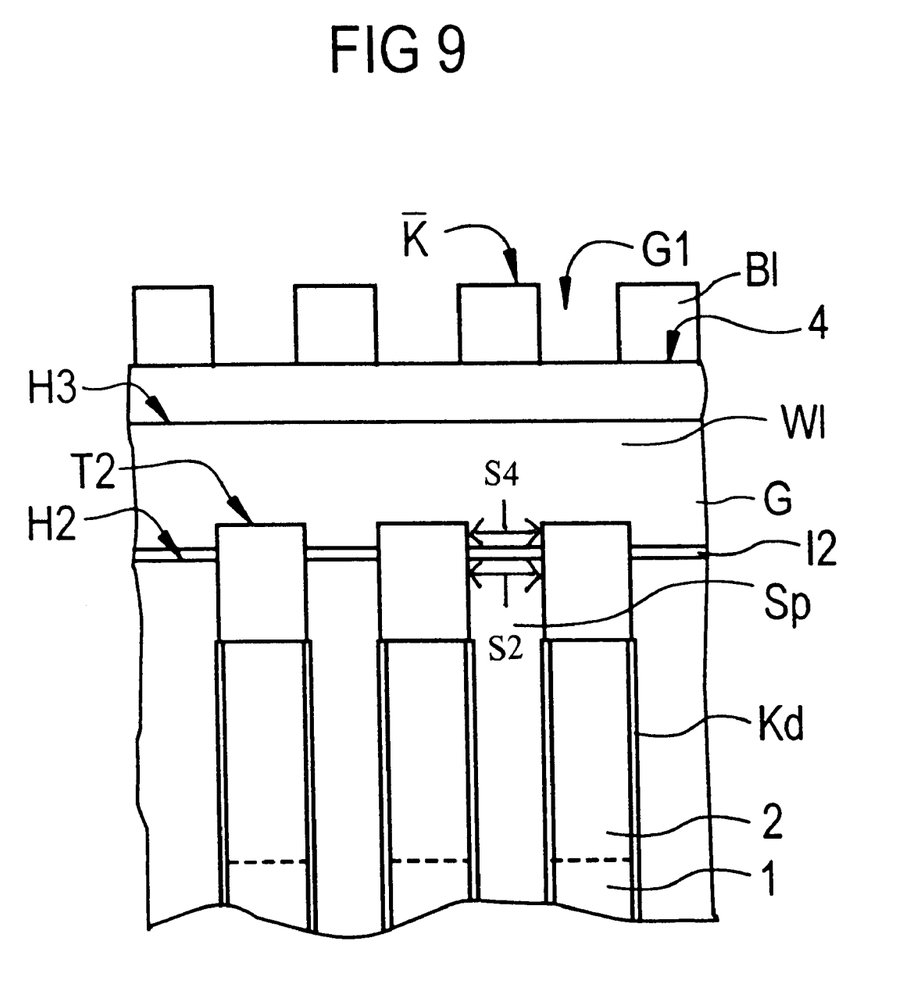
FIG. 9 is a fragmentary, sectional view showing the section of FIG. 2 along a second trench after the production of the bit lines.

Bit lines B1 are produced by depositing and structuring conductive material, with the aid of a third photoresist mask having a form which corresponds to that of the first photoresist mask. The bit lines B1 are disposed in such a way that they overlap the first source/drain regions S/D1, as is seen in FIGS. 8 and 9. The conductive material contains e.g. polysilicon, metal silicide and/or tungsten.

Each MOS transistor includes a gate electrode G, which is part of a word line W1, two first source/drain regions S/D1, which have been produced by structuring the third layer 3 and overlap a bit line B1, two channel regions which run perpendicular to the surface 4, are located within the second layer 2 and are each adjoined by a gate oxide, and two second source/drain regions S/D2, which have been produced by outdiffusion of dopant from a storage node Sp into the second layer 2 and are connected to the storage node Sp, as is seen in FIG. 8. SiO$_2$ in the first trenches G1 insulates neighboring transistors from one another in the word line direction, as well as word lines W1 from bit lines B1. The storage nodes Sp are disposed underneath the gate electrodes G.

Instead of the first SiO$_2$ layer O1, it is possible to form a layer on the surface 4 including e.g. three partial layers, of which a middle partial layer having a thickness of approximately 80 nm contains silicon nitride. A lower partial layer made of SiO$_2$ and having a thickness of approximately 20 nm, which is intended to prevent superficial damage to the substrate by silicon nitride, is produced through the use of thermal oxidation. An upper partial layer made of SiO$_2$ and having a thickness of approximately 50 nm is produced in a TEOS process, for example. It is thus necessary to etch not only SiO$_2$ but also silicon nitride in each etching process which uncovers parts of the surface 4. This alternative reduces the risk of excessively deep etching being effected during the opening of the contacts of the first source/drain regions S/D1, which would lead to a short circuit between word lines W1 and bit lines B1 seen in FIG. 9.

Many variations of the exemplary embodiment which likewise lie within the scope of the invention are conceivable. In particular, the dimensions of the layers and trenches that are presented can be adapted in any desired way to the respective requirements. The same also applies to the dopant concentrations proposed. Structures and layers made of SiO$_2$ can be produced by thermal oxidation or by a TEOS process.

We claim:

1. A method for the production of a DRAM cell configuration, which comprises:

producing memory cells each having a read-out transistor and a storage capacitor with a storage node;

producing bit and word lines;

forming the read-out transistor as a vertical MOS transistor integrated in a substrate of semiconductor material;

providing the MOS transistor with two first source/drain regions each belonging to a further, adjacent vertical MOS transistor, disposed separately one after the other along the bit line and adjoining the bit line, two second source/drain regions each connected to the storage node;

producing two channel regions;

producing a gate oxide adjoined by the two channel regions;

producing a gate electrode between the two channel regions;

adjoining exactly two opposite sides of the gate electrode with the gate oxide;

electrically connecting the gate electrodes of adjacent MOS transistors along the word line; and placing the gate electrode and the storage node one under the other.

2. The method according to claim 1, which comprises:

forming the substrate with a first layer doped by a first conductivity type, a second layer doped by a second conductivity type opposite to the first conductivity type, and a third layer doped by the first conductivity type and adjoining a surface of the substrate;

producing first trenches in strip form running substantially parallel and cutting through the third layer, by etching with a first mask;

producing second trenches each running in strip form and substantially parallel, cutting through the third layer, crossing the first trenches in crossover regions and being shallower in the crossover regions than in regions in between;

producing the first source/drain regions as remaining parts of the third layer;

partially providing the first trenches with insulating material electrically insulating the first and second source/drain regions of adjacent MOS transistors from one another along the word line;

providing the second trenches with capacitor dielectrics, the storage nodes, the gate oxides and the gate electrodes; and applying the bit lines to the surface transversely relative to the word lines with a mask, causing the first source/drain regions to adjoin the bit lines.

3. The method according to claim 2, which comprises:

initially forming the storage nodes and then the gate electrodes;

initially producing a first insulation structure on the second trenches to form the storage nodes, for surrounding the second trenches on all sides with insulating material;

forming the storage nodes, after the production of the first insulation structure, by providing the second trenches with a material doped by the first conductivity type up to a first level above an interface between the first layer and the second layer and below an interface between the second layer and the third layer;

additionally forming the storage nodes by subsequently removing part of the first insulation structure between the first level and the surface, to form a capacitor dielectric;

additionally forming the storage nodes by subsequently providing the second trenches with a material doped by the first conductivity type up to a second level above the first level and below the interface between the second layer and the third layer;

producing a gate oxide before forming the gate electrode;

subsequently forming the gate electrode by filling the second trenches with a conductive material up to a third level above the interface between the second layer and the third layer, for additionally producing the word line;

filling the second trenches with insulating material up to the surface after the formation of the gate electrodes; and forming the second source/drain regions by outdiffusion of dopant of the storage node into the second layer.

4. The method according to claim 3, which comprises:

forming the first trenches by producing and structuring a first $SiO_2$ layer with photolithographic processes, for uncovering semiconductor material;

removing remaining parts of the first $SiO_2$ layer before the bit lines are produced;

forming the second trenches by depositing $SiO_2$ for filling the first trenches, and subsequently selectively etching $SiO_2$ relative to semiconductor material with photolithographic processes, for uncovering semiconductor material in regions located between the crossover regions;

forming the second trenches by etching semiconductor material, after the semiconductor material has been uncovered in the regions located between the crossover regions;

filling the second trenches with material up to the first level, the second level and the third level and up to the surface in each case by deposition of the material, for completely filling the second trenches, and respective subsequent etching of the material down to the first level, the second level, the third level, and the surface.

5. The method according to claim 4, which comprises:

forming the first trenches by depositing a silicon nitride layer over the whole area before the $SiO_2$ layer is produced;

additionally forming the first trenches by structuring the $SiO_2$ layer and the silicon nitride layer with photolithographic processes, for uncovering semiconductor material; and removing remaining parts of the silicon nitride layer before the bit lines are produced.

* * * * *